(12) United States Patent
Park et al.

(10) Patent No.: US 8,828,802 B1
(45) Date of Patent: Sep. 9, 2014

(54) WAFER LEVEL CHIP SCALE PACKAGE AND METHOD OF FABRICATING WAFER LEVEL CHIP SCALE PACKAGE

(75) Inventors: Sung Su Park, Seoul (KR); Kyung Han Ryu, Kyunggi-do (KR); Sang Mok Lee, Seoul (KR)

(73) Assignee: Amkor Technology, Inc.

( * ) Notice: Subject to any disclaimer, the term of this patent is extended or adjusted under 35 U.S.C. 154(b) by 276 days.

(21) Appl. No.: 13/286,903

(22) Filed: Nov. 1, 2011

(51) Int. Cl.
*H01L 23/48* (2006.01)
*H01L 21/98* (2006.01)

(52) U.S. Cl.
USPC ... 438/118; 257/698; 257/E23.01; 257/E21.705

(58) Field of Classification Search
USPC ......... 257/621, 659, 692, 698, 737, 738, 773, 257/774, E21.499, E21.502, E21.599, 257/E23.011, E23.116, E23.174, 778, 257/E21.705; 438/110, 113, 127, 637, 667, 438/118, 119
See application file for complete search history.

(56) References Cited

U.S. PATENT DOCUMENTS

| | | | |
|---|---|---|---|
| 6,395,578 B1 | 5/2002 | Shin et al. | |
| 6,905,914 B1 | 6/2005 | Huemoeller et al. | |
| 2009/0178836 A1* | 7/2009 | Fujii | 174/260 |
| 2010/0301474 A1* | 12/2010 | Yang | 257/737 |

* cited by examiner

*Primary Examiner* — Daniel Shook
(74) *Attorney, Agent, or Firm* — McAndrews, Held & Malloy, Ltd.

(57) ABSTRACT

A wafer level chip scale package includes a first dielectric layer having a first surface, a second surface, and a main through hole passing through the first dielectric layer between the first and second surfaces. A semiconductor die is disposed in the main through hole of the first dielectric layer and including a bond pad disposed away from the first surface of the first dielectric layer. A redistribution layer is electrically connected to the bond pad of the semiconductor die and extends along the second surface of the first dielectric layer. A second dielectric layer covers the first dielectric layer and the redistribution layer and has an opening exposing the redistribution layer. An under bump metal fills the opening of the second dielectric layer and is electrically connected to the redistribution layer. A solder ball is electrically connected to the under bump metal.

20 Claims, 4 Drawing Sheets

WAFER LEVEL CHIP SCALE PACKAGE AND METHOD OF FABRICATING WAFER LEVEL CHIP SCALE PACKAGE

TECHNICAL FIELD

The present application relates to a wafer level chip scale package and a method of fabricating the wafer level chip scale package.

BACKGROUND

Wafer level chip scale packages are fabricated by attaching semiconductor dies onto adhesive tape, encapsulating the semiconductor dies with an encapsulant, removing the adhesive tape from the semiconductor dies and the encapsulant, forming a redistribution layer on the semiconductor dies and the encapsulant, attaching solder balls to the redistribution layer, and sawing the semiconductor dies into semiconductor devices.

BRIEF DESCRIPTION OF THE DRAWINGS

In the following description, the same or similar elements are labeled with the same or similar reference numbers.

DETAILED DESCRIPTION

Figure 1:
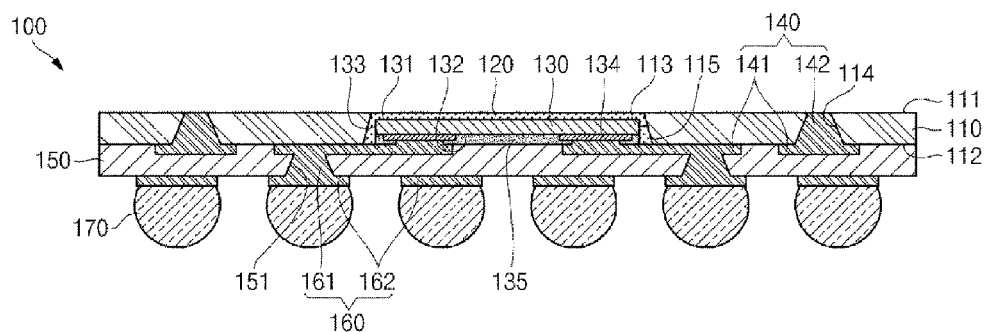
FIG. 1 is a cross-sectional view illustrating a wafer level chip scale package according to an embodiment.

As an overview and in accordance with one embodiment, referring to FIG. 1, a wafer level chip scale package 100 includes a first dielectric layer 110 having a first surface 111, a second surface 112, and a main through hole 113 passing through the first dielectric layer 110 between the first and second surfaces 111, 112.

A semiconductor die 130 is disposed in the main through hole 113 of the first dielectric layer 110 and including a bond pad 134 disposed away from the first surface 111 of the first dielectric layer 110.

A redistribution layer 140 is electrically connected to the bond pad 134 of the semiconductor die 130 and extending along the second surface 112 of the first dielectric layer 110. A second dielectric layer 150 covers the first dielectric layer 110 and the redistribution layer 140 and has an opening 151 exposing the redistribution layer 140.

An under bump metal 160 fills the opening 151 of the second dielectric layer 150 and is electrically connected to the redistribution layer 140. A solder ball 170 is electrically connected to the under bump metal 160.

As such, the wafer level chip scale package 100 includes no typical encapsulation or molding material, and thus, is free from contamination due to a typical encapsulation or molding material while the wafer level chip scale package 100 is fabricated.

In one embodiment, the first dielectric layer 110 has a similar coefficient of thermal expansion to the second dielectric layer 150. Accordingly, warpage of the wafer level chip scale package 100 is prevented while or after the wafer level chip scale package 100 is fabricated.

In addition, since a hard cure process for the first and second dielectric layers 110 and 150 is unnecessary, process costs of the wafer level chip scale package 100 can be significantly reduced.

Now in more detail, referring to FIG. 1, a wafer level chip scale package 100 according to an embodiment is illustrated in a cross-sectional view.

That is, referring to FIG. 1, a wafer level chip scale package 100 according to the current embodiment includes a first dielectric layer 110, an adhesive layer 120, a semiconductor die 130, a redistribution layer 140, a second dielectric layer 150, a plurality of under bump metals 160, and a plurality of solder balls 170.

The first dielectric layer 110 has a first surface 111 that is approximately planar, a second surface 112 that is approximately planar and opposed to the first surface 111, a main through hole 113 that passes through the first and second surfaces 111 and 112, and a plurality of sub-through holes 114 that are disposed outside the main through hole 113 and pass through the first and second surfaces 111 and 112. More particularly, the main through hole 113 and the sub-through holes 114 pass completely through the first dielectric layer 110 and extend between the first and second surfaces 111 and 112.

The semiconductor die 130 is disposed in the main through hole 113. Conductive vias 142 are disposed in the sub-through holes 114. A width of the main through hole 113 is greater than that of the sub-through holes 114. Diameters of the main through hole 113 and the sub-through holes 114 in the second surface 112 are greater than those in the first surface 111. That is, the sizes of the main through hole 113 and the sub-through holes 114 gradually increase toward the second surface 112 from the first surface 111.

The first dielectric layer 110 may be formed of one of polyimide (PI), poly benz oxazole (PBO), benzo cyclo butene (BCB), epoxy, and an equivalent thereof, but is not limited thereto.

The adhesive layer 120 is disposed in the main through hole 113. That is, the adhesive layer 120 fills a portion of the main through hole 113 corresponding to the first surface 111, and is disposed on a surface 115 defining the main through hole 113. The adhesive layer 120 substantially covers a first surface 131 and a third surface 133 of the semiconductor die 130, which will be described later. That is, the adhesive layer 120 covers the first surface 131 of the semiconductor die 130, and fills a space between the third surface 133 of the semiconductor die 130 and the surface 115 defining the main through hole 113.

The adhesive layer 120 is flush with the first surface 111 of the first dielectric layer 110. Thus, the adhesive layer 120 is exposed out of the first surface 111 of the first dielectric layer 110. That is, an exposed surface of the adhesive layer 120 is flush with the first surface 111 of the first dielectric layer 110.

The adhesive layer 120 may be formed of a typical adhesive for a semiconductor. That is, the adhesive layer 120 may be formed of any adhesive for a semiconductor, provided that the adhesive is a thermosetting material, and has a low coefficient of thermal expansion, a high glass transition temperature (Tg), and the minimum amount of ion components. For example, the adhesive layer 120 may be formed of a silver-filled conductive adhesive or an insulating adhesive. The adhesive layer 120 may include a die attach adhesive, a glob top material, or an underfill. However, a material used to form the adhesive layer 120 is not limited to the above-described materials.

The semiconductor die 130 includes the first surface 131 that is approximately planar, a second surface 132 that is approximately planar and opposed to the first surface 131, and the third surface 133 that connects the first and second surfaces 131 and 132 to each other. Bond pads 134 are disposed on the second surface 132 of the semiconductor die 130. A passivation film 135 may be disposed at the peripheries of the bond pads 134.

As described above, the first and third surfaces 131 and 133 of the semiconductor die 130 are covered with the adhesive layer 120. However, the bond pads 134 of the semiconductor die 130 are not covered with the adhesive layer 120, and are disposed away from the first surface 111 of the first dielectric layer 110. The bond pads 134 are substantially disposed at the side of the second surface 112 of the first dielectric layer 110, and may be flush with the second surface 112 of the first dielectric layer 110.

The redistribution layer 140 is electrically connected to the bond pads 134, and extends along the second surface 112 of the first dielectric layer 110. In more detail, the redistribution layer 140 includes a plurality of conductive patterns 141 and a plurality of the conductive vias 142. The conductive patterns 141 are electrically connected to the bond pads 134, and extend a predetermined length outward along the second surface 112 of the first dielectric layer 110. The conductive vias 142 are electrically connected to the conductive patterns 141, and fill the sub-through holes 114.

Thus, the conductive vias 142 filling the sub-through holes 114 are exposed through the first surface 111 of the first dielectric layer 110. For example, exposed surfaces of the conductive vias 142 may be flush with the first surface 111 of the first dielectric layer 110.

The redistribution layer 140 may be formed of one of copper, a copper alloy, aluminum, an aluminum alloy, silver, a silver alloy, gold, a gold alloy, nickel, a nickel alloy, palladium, a palladium alloy, stannum, a stannum alloy, and an equivalent thereof, but is not limited thereto.

The second dielectric layer 150 covers the first dielectric layer 110 and the redistribution layer 140, and includes openings 151 to expose specific regions of the redistribution layer 140. More particularly, first portions of the redistribution layer 140 are covered by the second dielectric layer 150 while second portions of the redistribution layer 140 are exposed by the openings 151.

A diameter of the openings 151 near the first dielectric layer 110 is smaller than a diameter thereof away from the first dielectric layer 110. The second dielectric layer 150 may be formed of one of PI, PBO, BCB, epoxy, and an equivalent thereof, but is not limited thereto.

The first and second dielectric layers 110 and 150 may be formed of the same material, or different materials. For example, the first and second dielectric layers 110 and 150 may be formed of materials having the same coefficient of thermal expansion to minimize warpage of the wafer level chip scale package 100.

The under bump metals 160 fill the openings 151 of the second dielectric layer 150, and electrically connect to the redistribution layer 140. The under bump metals 160 include a plurality of conductive vias 161 and a plurality of lands 162. The conductive vias 161 fill the openings 151 of the second dielectric layer 150, and electrically connects to the redistribution layer 140. The lands 162 are electrically connected to the conductive vias 161 of the under bump metals 160, and extend a predetermined length along a surface of the second dielectric layer 150.

The under bump metal 160 may be formed of one of well-known materials, including Ti(W)/Cu; Al/Electroless Ni/Immersion Au; Al/Electroless Ni/Pd/Au; AlCu/Electroless Ni/Immersion Au; AlCuSi/Electroless Ni/Immersion Au; and AlSi/Electroless Ni/Immersion Au, but is not limited thereto.

The solder balls 170 are electrically connected to the lands 162. The solder ball 170 completely or substantially covers the land 162, and has an approximately sphere shape.

As such, the wafer level chip scale package 100 includes no typical encapsulation or molding material, and thus, is free from contamination due to a typical encapsulation or molding material while the wafer level chip scale package 100 is fabricated.

In addition, since the first dielectric layer 110 is similar in coefficient of thermal expansion to the second dielectric layer 150, warpage of the wafer level chip scale package 100 is prevented while or after the wafer level chip scale package 100 is fabricated.

In addition, since a hard cure process for the first and second dielectric layers 110 and 150 is unnecessary, process costs of the wafer level chip scale package 100 can be significantly reduced.

An electrical signal from the semiconductor die 130 may be transmitted to an external device through the bond pad 134, the redistribution layer 140, the under bump metal 160, and then the solder ball 170. An electrical signal from an external device may be transmitted to the semiconductor die 130 through the solder ball 170, the under bump metal 160, the redistribution layer 140, and then the bond pad 134.

When a semiconductor device is disposed on the wafer level chip scale package 100, the semiconductor device may be electrically connected to the conductive vias 142 of the redistribution layer 140 exposed through the first dielectric layer 110, which will be described later.

In another embodiment, e.g., where stacking of a semiconductor device on the wafer level chip scale package 100 is not desired, the wafer level chip scale package 100 is formed without the conductive vias 142 of the redistribution layer 140. Accordingly, formation of conductive vias 142 is optional, and in one embodiment, conductive vias 142 are not formed.

Referring to FIGS. 2A to 2J, a method of fabricating the wafer level chip scale package 100 is illustrated in cross-sectional views, according to another embodiment.

That is, referring to FIGS. 2A to 2J, in a method of fabricating the wafer level chip scale package 100, the first dielectric layer 110 is formed, the first dielectric layer 110 is patterned, the adhesive layer 120 is printed, the semiconductor die 130 is attached, the redistribution layer 140 is formed and patterned, the second dielectric layer 150 is printed, the second dielectric layer 150 is patterned, the under bump metals 160 are formed and patterned, the solder balls 170 are attached, and a carrier 180 is removed.

Figure 2A:
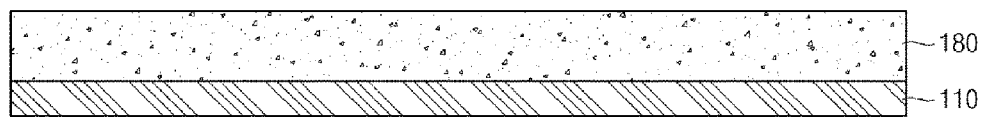
FIGS. 2A, 2B, 2C, 2D, 2E, 2F, 2G, 2H, 2I, 2J are cross-sectional views illustrating a method of fabricating the wafer level chip scale package of FIG. 1 according to one embodiment.

Referring to FIG. 2A, to form the first dielectric layer 110, the carrier 180 having an approximately planar surface is prepared, and the surface of the carrier 180 is coated with the first dielectric layer 110 having a predetermined thickness, and is cured.

The carrier 180 may be a glass substrate, a ceramic substrate, a silicon substrate, a plastic substrate, or a metal substrate, but is not limited thereto.

The first dielectric layer 110 may be formed of one of PI, PBO, BCB, epoxy, and an equivalent thereof, but is not limited thereto.

Figure 2B:
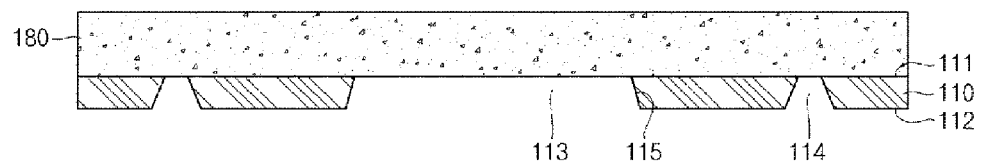

Referring to FIG. 2B, when the first dielectric layer 110 is patterned, a precise photoetching process is performed on the first dielectric layer 110 having a predetermined thickness on the carrier 180, to form patterns having predetermined shapes. That is, a precise photoetching process is performed on the first dielectric layer 110 to form the main through hole 113 and a plurality of the sub-through holes 114 in the first dielectric layer 110. The surface of the carrier 180 is exposed through the main through hole 113 and the plurality of the sub-through holes 114. The main through hole 113 may be wider than the sub-through hole 114.

The photoetching process may be performed with a high precision apparatus. That is, when a photoetching process is performed on the first dielectric layer 110 with a high precision apparatus, position accuracy of the first dielectric layer 110 is improved, and die shift is prevented.

Figure 2C:
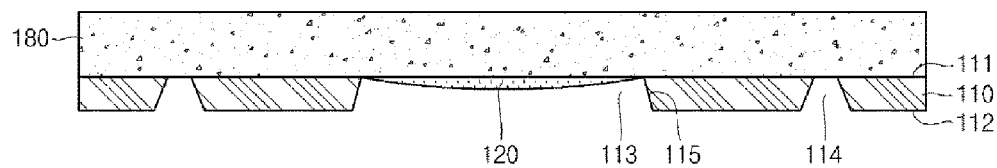

Referring to FIG. 2C, the adhesive layer 120 is printed with a predetermined amount in the main through hole 113 of the first dielectric layer 110. The adhesive layer 120 is substantially formed on the carrier 180 exposed through the main through hole 113.

The adhesive layer 120 may be formed of a silver-filled conductive adhesive or an insulating adhesive. The adhesive layer 120 may include a die attach adhesive, a glob top material, or an underfill.

Figure 2D:
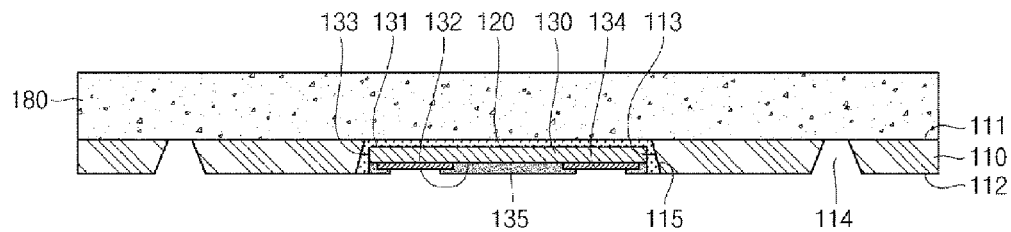

Referring to FIG. 2D, the semiconductor die 130 having the bond pads 134 is attached to the adhesive layer 120. The bond pads 134 are disposed on the opposite side of the semiconductor die 130 to the adhesive layer 120. When the semiconductor die 130 is attached to the adhesive layer 120, the adhesive layer 120 is also disposed between the third surface 133 of the semiconductor die 130 and the surface 115 defining the main through hole 113.

Figure 2E:
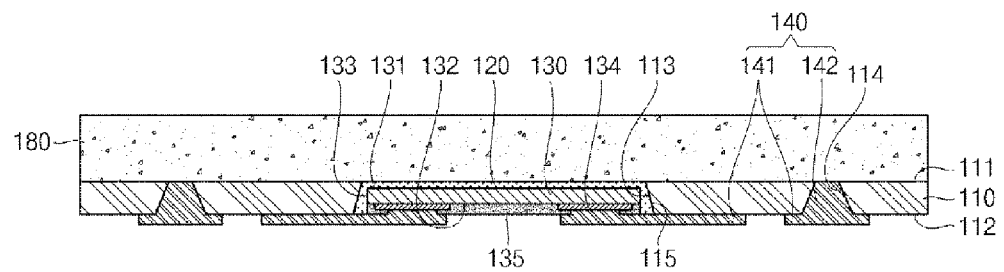

Referring to FIG. 2E, the redistribution layer 140 is formed on the semiconductor die 130 and the first dielectric layer 110, and is patterned. That is, a conductive layer is formed on the first dielectric layer 110 and the semiconductor die 130 and in the sub-through holes 114, and a typical photoetching process is performed on the conductive layer to form the redistribution layer 140 including the conductive patterns 141 and the conductive vias 142.

The conductive patterns 141 extend along the second surface 112 of the first dielectric layer 110 from the bond pads 134 of the semiconductor die 130, and the conductive vias 142 fill the sub-through holes 114. The conductive patterns 141 are electrically connected to the conductive vias 142.

The redistribution layer 140 may be formed of one of copper, a copper alloy, aluminum, an aluminum alloy, silver, a silver alloy, gold, a gold alloy, nickel, a nickel alloy, palladium, a palladium alloy, stannum, a stannum alloy, and an equivalent thereof, but is not limited thereto.

Figure 2F:
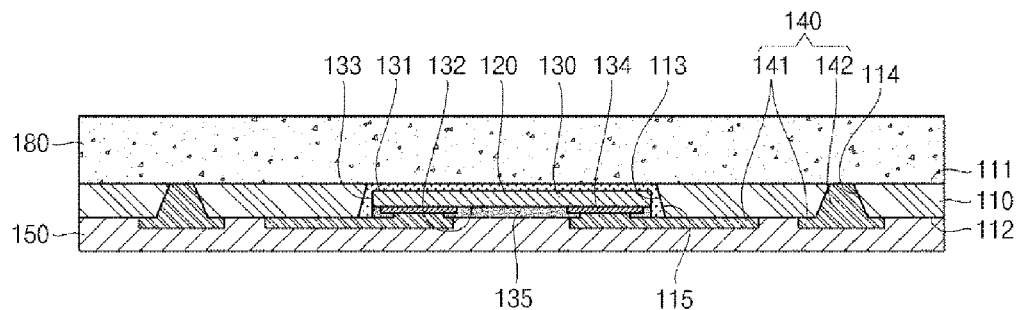

Referring to FIG. 2F, the second dielectric layer 150 having a predetermined thickness is printed on the first dielectric layer 110, the semiconductor die 130, and the redistribution layer 140, and is cured.

The second dielectric layer 150 may be formed of one of PI, PBO, BCB, epoxy, and an equivalent thereof, but is not limited thereto.

Figure 2G:
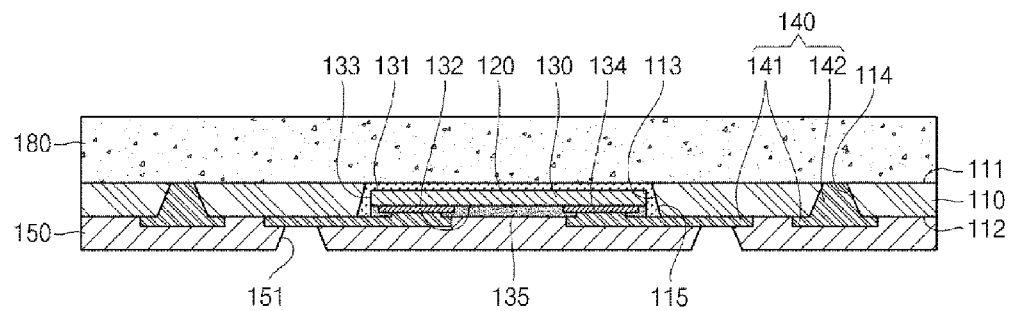

Referring to FIG. 2G, when the second dielectric layer 150 is patterned, a typical photoetching process is performed on the second dielectric layer 150 to form patterns having predetermined shapes. That is, a typical photoetching process is performed on the second dielectric layer 150 to form the openings 151 in the second dielectric layer 150. Thus, predetermined regions of the redistribution layer 140 are exposed through the openings 151.

Figure 2H:
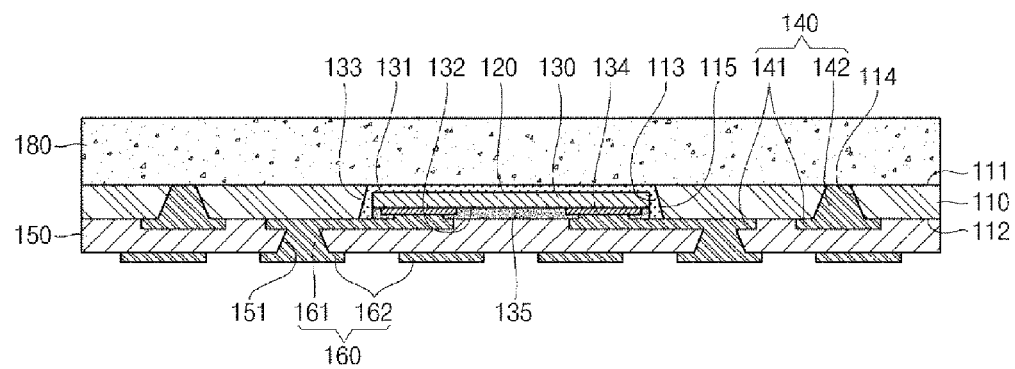

Referring to FIG. 2H, the under bump metals 160 are formed on the second dielectric layer 150 and in the openings 151, and are patterned. That is, a conductive layer is entirely formed on the second dielectric layer 150 and in the openings 151, and a typical photoetching process is performed on the conductive layer to form the under bump metals 160 including the conductive vias 161 and the lands 162. The conductive vias 161 fill the openings 151, and the lands 162 are formed on the conductive vias 161 and the second dielectric layer 150. The conductive vias 161 are electrically connected to the lands 162.

The under bump metal 160 may be formed of one of well-known materials, including Ti(W)/Cu; Al/Electroless Ni/Immersion Au; Al/Electroless Ni/Pd/Au; AlCu/Electroless Ni/Immersion Au; AlCuSi/Electroless Ni/Immersion Au; and AlSi/Electroless Ni/Immersion Au, but is not limited thereto.

Figure 2I:
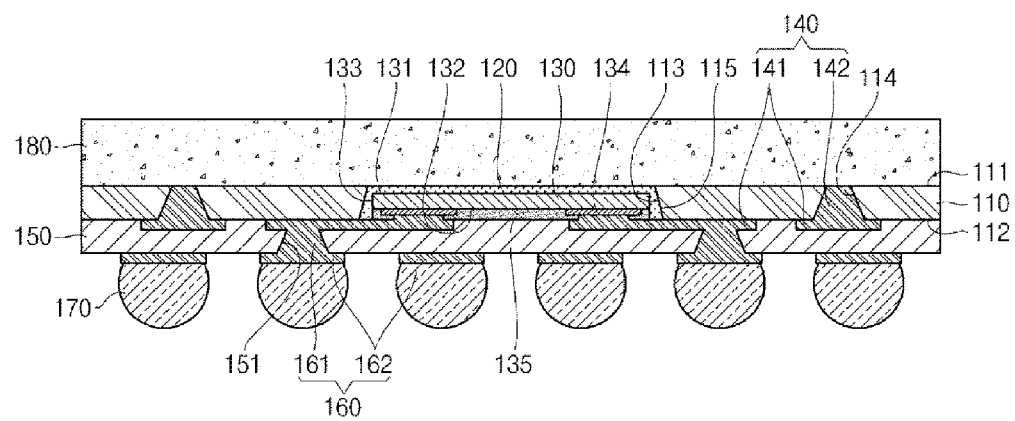

Referring to FIG. 2I, the solder balls 170 are attached to the lands 162 of the under bump metals 160. For example, a volatile flux may be applied to the lands 162, and the solder balls 170 may be disposed on the flux. Then, when the solder balls 170 are heated at a temperature ranging from about 150° C. to about 250° C., the flux is evaporated and removed, and the solder balls 170 are molten to directly contact the lands 162. Then, the solder balls 170 are cooled to room temperature, and the solder balls 170 having a sphere shape are connected to the lands 162.

The above processes described with reference to FIGS. 2A to 2I may be performed in the state where FIGS. 2A to 2I are upside down. That is, the carrier 180 may be disposed at the lower side, and the first dielectric layer 110, the adhesive layer 120, the semiconductor die 130, the redistribution layer 140, the second dielectric layer 150, the under bump metals 160, and the solder balls 170 may be sequentially formed on the carrier 180. However, the present disclosure is not limited thereto.

Figure 2J:
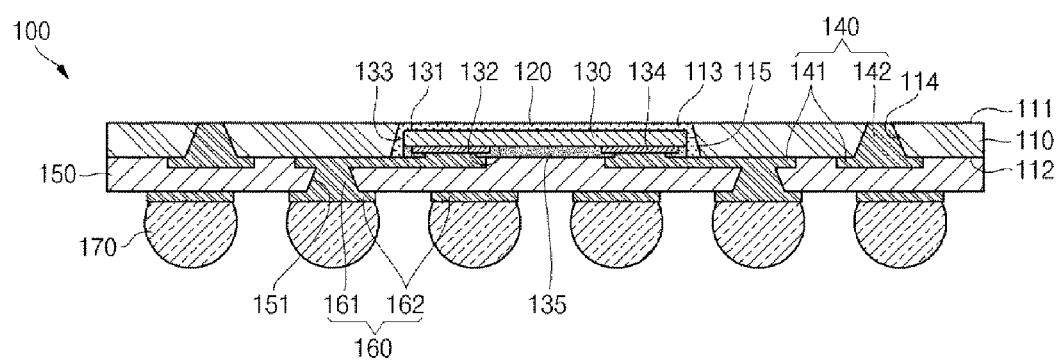

Referring to FIG. 2J, the carrier 180 is removed from the first dielectric layer 110, the adhesive layer 120, and the conductive vias 142. To this end, a laser beam, an infrared ray, an ultraviolet ray, or heat may be provided to the carrier 180.

For example, when a laser beam is provided to the carrier 180, the laser beam may be focused on an interface between the carrier 180 and the first dielectric layer 110, an interface between the carrier 180 and the adhesive layer 120, and interfaces between the carrier 180 and the conductive vias 142. Then, the interfaces momentarily reach a high temperature state, and are molten, so that the carrier 180 can be easily removed.

According to the above-described embodiments, a conductive via, which would be difficult to form on a molding layer, can be formed using a printing process and a photoetching process, and can be used as a pad for a three-dimensional wafer level fan out package.

In addition, since the wafer level chip scale package 100 is formed using a printing process instead of a molding process, the thickness thereof can be decreased.

Figure 3:
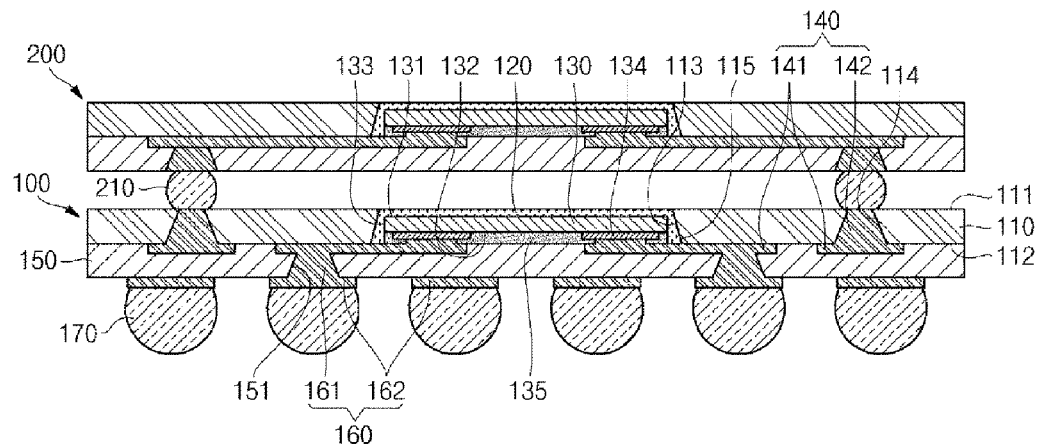
FIG. 3 is a cross-sectional view illustrating a package disposed on the wafer level chip scale package of FIG. 1 according to an embodiment.

Referring to FIG. 3, a package 200 disposed on the wafer level chip scale package 100 according to an embodiment is illustrated in a cross-sectional view.

That is, referring to FIG. 3, the package 200, sometimes called a semiconductor device 200, may be connected to the wafer level chip scale package 100. In more detail, the semiconductor device 200 may be electrically connected through solder balls 210 to the conductive vias 142 of the wafer level chip scale package 100.

The semiconductor device 200 may be similar in structure to the wafer level chip scale package 100, but is not limited thereto.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method of fabricating a wafer level chip scale package comprising:
   printing a first dielectric layer on a carrier;
   forming a main through hole in the first dielectric layer to expose the carrier;
   forming an adhesive layer on a surface of the carrier exposed through the main through hole of the first dielectric layer;
   attaching a semiconductor die to the adhesive layer;
   forming a redistribution layer coupled to the semiconductor die and the first dielectric layer;
   printing a second dielectric layer on the first dielectric layer and the redistribution layer;
   forming an opening in the second dielectric layer to expose the redistribution layer;
   forming an under bump metal coupled to the redistribution layer through the opening; and
   coupling a solder ball to the under bump metal.

2. The method as claimed in claim 1, further comprising removing the carrier from the first dielectric layer.

3. The method as claimed in claim 2, wherein a surface of the adhesive layer and a surface of the first dielectric layer are coplanar and exposed at a top surface of the wafer level chip scale package.

4. The method as claimed in claim 1, wherein the first dielectric layer comprises a sub-through hole.

5. The method as claimed in claim 4, wherein the sub-through hole has a width smaller than that of the main through hole.

6. The method as claimed in claim 4, comprising coupling a second wafer level chip scale package to the wafer level chip scale package via conductive material in the sub-through hole.

7. The method as claimed in claim 1, wherein said printing a first dielectric layer comprises coating the first dielectric layer on the carrier.

8. The method as claimed in claim 1, wherein said forming a main through hole comprises etching the main through hole in the first dielectric layer.

9. The method as claimed in claim 8, wherein said etching the main through hole comprises photo-etching the main through hole in the first dielectric layer.

10. The method as claimed in claim 1, wherein the first and second dielectric layers are formed of a same material.

11. The method as claimed in claim 1, wherein:
    the first dielectric layer is formed of at least one of: PI, PBO, BCB, and/or epoxy; and
    the second dielectric layer is formed of at least one of: PI, PBO, BCB, and/or epoxy.

12. A method of fabricating a wafer level chip scale package comprising:
    printing a first dielectric layer on a carrier;
    forming a main through hole and a sub-through hole in the first dielectric layer to expose the carrier;
    forming an adhesive layer on a surface of the carrier exposed through the main through hole of the first dielectric layer;
    attaching a semiconductor die to the adhesive layer;
    forming a redistribution layer comprising:
        forming a conductive pattern coupled to the first dielectric layer and coupled to a bond pad of the semiconductor die and; and
        forming a conductive via coupled to the conductive pattern and filling the sub-through hole;
    printing a second dielectric layer on the first dielectric layer and the redistribution layer;
    forming an opening in the second dielectric layer to expose the redistribution layer; and
    forming an under bump metal coupled to the redistribution layer through the opening.

13. The method as claimed in claim 12, wherein the conductive via filling the sub-through hole is exposed through a first surface of the first dielectric layer.

14. The method as claimed in claim 12, wherein the semiconductor die has:
    a first surface oriented in a same direction as a first surface of the first dielectric layer;
    a second surface oriented in a same direction as a second surface of the first dielectric layer; and
    a third surface connecting the first and second surfaces of the semiconductor die to each other,
    wherein the first and third surfaces of the semiconductor die are covered with the adhesive layer.

15. The method as claimed in claim 14, wherein the adhesive layer is disposed between a surface defining the main through hole and the third surface of the semiconductor die.

16. The method as claimed in claim 14, wherein the adhesive layer is exposed through the first surface of the first dielectric layer.

17. The method as claimed in claim 12, wherein said forming a main through hole comprises etching the main through hole in the first dielectric layer.

18. The method as claimed in claim 12, wherein the first and second dielectric layers are formed of a same material.

19. The method as claimed in claim 12, comprising coupling a second wafer level chip scale package to the wafer level chip scale package through the conductive via.

20. The method as claimed in claim 12, comprising removing the carrier from the first dielectric layer, and wherein a surface of the adhesive layer and a surface of the first dielectric layer are coplanar and exposed at a top surface of the wafer level chip scale package.

* * * * *